United States Patent
Waffenschmidt et al.

(10) Patent No.: US 7,915,991 B2
(45) Date of Patent: Mar. 29, 2011

(54) FRACTIONAL TURNS TRANSFORMERS WITH FERRITE POLYMER CORE

(75) Inventors: Eberhard Waffenschmidt, Aachen (DE); Thomas Dürbaum, Baiersdorf (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 192 days.

(21) Appl. No.: 10/570,692

(22) PCT Filed: Aug. 24, 2004

(86) PCT No.: PCT/IB2004/051542
§ 371 (c)(1), (2), (4) Date: Mar. 2, 2006

(87) PCT Pub. No.: WO2005/024862
PCT Pub. Date: Mar. 17, 2005

(65) Prior Publication Data
US 2007/0030107 A1    Feb. 8, 2007

(30) Foreign Application Priority Data

Sep. 4, 2003 (EP) .................................. 03102693

(51) Int. Cl.
*H01F 5/00* (2006.01)
(52) U.S. Cl. ........... 336/200; 336/20; 336/223; 336/232
(58) Field of Classification Search .......... 336/200, 336/20, 232, 223
See application file for complete search history.

(56) References Cited

U.S. PATENT DOCUMENTS

| | | | |
|---|---|---|---|
| 6,307,458 B1 | 10/2001 | Zhang et al. | |
| 6,400,249 B1* | 6/2002 | Jitaru | 336/212 |
| 6,727,794 B2* | 4/2004 | Busletta et al. | 336/200 |
| 6,809,268 B2* | 10/2004 | Hayashi et al. | 174/260 |
| 6,867,678 B2* | 3/2005 | Yang | 336/200 |
| 6,903,938 B2* | 6/2005 | Waffenschmidt | 361/779 |
| 6,975,098 B2* | 12/2005 | Vinciarelli | 323/266 |

FOREIGN PATENT DOCUMENTS

| | | |
|---|---|---|
| EP | 1 282 143 | 2/2003 |
| GB | 2083952 A1 | 3/1982 |
| JP | 57050410 A | 3/1982 |
| JP | 57053916 A | 3/1982 |

OTHER PUBLICATIONS

S. Chandrasekaran et al.: "A new Matrix Integrated Magnetics (MIN) Structure . . . "; Proceedings of the 33$^{rd}$ Power Specialist Conference (TISC) 2002; Cairns Australia IIII; Publication No. 10875; pp. 1230-1235.

* cited by examiner

*Primary Examiner* — Anh T Mai
*Assistant Examiner* — Joselito Baisa

(57) ABSTRACT

Conventional transformers with fractional turns have pre-manufactured cores usually with a complicated structure. According to the present invention, a method is provided of manufacturing a planar transformer where a ferrite polymer compound is laminated to a PCB for forming the core of the transformer. Advantageously, this may allow for the provision of a cheap and robust transformer.

21 Claims, 4 Drawing Sheets

FRACTIONAL TURNS TRANSFORMERS WITH FERRITE POLYMER CORE

Planar transformer and method for manufacturing the same.

The present invention relates to transformers and to a method of manufacturing transformers. In particular, the present invention relates to a method of manufacturing a transformer and to a transformer.

Many new products such as, for example, mobile phones make use of advanced integrated circuits having a low supply voltage. To supply such a circuit having a low supply voltage may require a transformer with a high turns ratio. With a conventional transformer, only whole numbers of turns can be realized. Therefore, the primary winding needs a high number of turns. Furthermore, in many cases not only one but more supply voltages are needed. Also the required turns ratios between the windings cannot be met with whole numbers. Therefore, it is desirable to have fractional turns.

A split inductor with fractional turns of each winding in the corresponding printed circuit board (PCB) is known, for example, from U.S. Pat. No. 6,307,458 B1. The inductor configuration according to the U.S. Pat. No. 6,307,458 B1 has an inductor core having first, second and third legs which are integrally extending from a base member. The first leg and second leg are predisposed, spaced and extend substantially perpendicular from a first surface of the base member to form a first channel area. Likewise, the second leg and the third leg are predisposed, spaced and extend substantially perpendicular from a second surface to form a second channel area separated from the first channel area by the second leg.

S. Chandrasekaran et al.: A New Matrix Integrated Magnetics (MIN) Structure for Low Voltage, High Current DC-DC Converters. Proceedings of the $33^{rd}$ Power Specialists Conference (TISC) 2002, Caims, Australia, IIII, Publication No. 10875, Paper-7-5-2, P. 1230-1235 suggests a planar component with fractional turns.

However, those components, suggested above, use pre-manufactured cores having special shapes which are specially adapted for the respective components. Such special shapes differ from the standard forms available on the market which are made in large amounts. The special manufacture of these cores is expensive and, therefore, unattractive for high volume electronics.

It is an object of the present invention to provide for a transformer which may be manufactured from a core material having a simple arrangement.

According to an exemplary embodiment of the present invention as set forth in claim 1, this object may be solved by a method of manufacturing a transformer wherein a printed circuit board is provided having at least one conductive layer. A primary winding and a plurality of secondary windings are formed on the printed circuit board by structuring the at least one conductive layer of the printed circuit board. Then, a ferrite polymer compound (FPC) is laminated to upper and lower sides of the printed circuit board forming a core of the planar transformer.

Advantageously, according to this exemplary embodiment of the present invention, no pre-manufactured core is required. Due to this, the planar transformer may be manufactured at reduced costs. Furthermore, due to the fact that the ferrite polymer compound is laminated to the printed circuit board such that the FPC adheres to the printed circuit board, a solid and reliable device may be manufactured.

According to another exemplary embodiment of the present invention as set forth in claim 2, the ferrite polymer compound is unstructured. Thus, in other words, the ferrite polymer compound may be used in the form of a batch material which does not need to be specially handled or structured. Due to the fact that such a structured ferrite polymer compound may be used in a plurality of applications, it may be manufactured in large amounts such that it may be manufactured at low costs. Due to this, a planar transformer may be manufactured at reduced costs making such planar transformers attractive for high volume electronics such as, for example, mobile phone PDAs, digital cameras or video cameras.

According to another exemplary embodiment of the present invention as set forth in claim 3, first recesses are formed in the printed circuit boards and the ferrite polymer compound is laminated to the printed circuit board such that after lamination, the ferrite polymer compound fills these recesses and covers at least parts of the upper and lower sides of the printed circuit board.

According to this exemplary embodiment of the present invention, the lamination process is controlled, for example, by controlling the temperature of the laminating process or the pressure applied during lamination such that the ferrite polymer compound fills the recesses, for example, to interconnect the ferrite polymer compound layers formed on the upper and lower sides of the printed circuit board. According to an aspect of this exemplary embodiment of the present invention, the ferrite polymer compound may be selected in accordance with the lamination process, i.e., with the temperature and/or pressure occurring during lamination.

According to another exemplary embodiment of the present invention as set forth in claim 4, the primary winding surrounds the plurality of secondary windings which are provided in an area of the primary windings such that fractional winding turns are formed.

Advantageously, the planar transformer manufactured according to this exemplary embodiment of the present invention allows for a high turns ratio. Thus, planar transformers may be provided and manufactured at low costs having a sub-winding input voltage to output voltage ratio.

According to another exemplary embodiment of the present invention, as set forth in claim 5, a transformer is manufactured where the arrangement of the primary and secondary windings and the core is such that during operation of the planar transformer, a flux through the primary winding is split into a plurality of paths. The flow of each path is fed through a secondary winding where it induces only half of the primary voltage. The secondary windings may be connected in parallel to achieve a high output current and a good coupling between primary and secondary windings.

Advantageously, according to this exemplary embodiment of the present invention, a simple method is provided allowing for the manufacturing of planar transformers having fractional turns at low costs which are solid and reliable.

According to another exemplary embodiment of the present invention as set forth in claim 6, a transformer is provided comprising a printed circuit board wherein a primary winding and a plurality of secondary windings are formed on the printed circuit board. A ferrite polymer compound (FPC) is laminated to upper and lower sides of the printed circuit board for forming a core of the planar transformer.

Advantageously, due to the lamination of the ferrite polymer compound to the printed circuit boards, a solid and reliable planar transformer may be provided. Furthermore, no pre-manufactured structured core is required which allows for a manufacturing of the planar transformer at low costs.

Claims 7 to 11 provide for exemplary embodiments of the transformer.

It may be seen as a gist of an exemplary embodiment of the present invention that a transformer with fractional turns is manufactured by using an unstructured ferrite polymer compound for forming the core. The ferrite polymer compound is laminated onto sides of a printed circuit board which has recesses and winding tracks for forming primary and secondary windings and for forming a plurality of flux paths through the printed circuit board when the ferrite polymer compound is laminated to the printed circuit board. Advantageously, no pre-manufactured structured core is required. Furthermore, due to the fact that the ferrite polymer compound adheres to the printed circuit board a solid and reliable planar transformer is provided.

These and other aspects of the present invention will become apparent from and elucidated with reference to the embodiments described hereinafter.

Exemplary embodiments of the present inventions will be described in the following, with reference to the following drawings.

Figure 1:
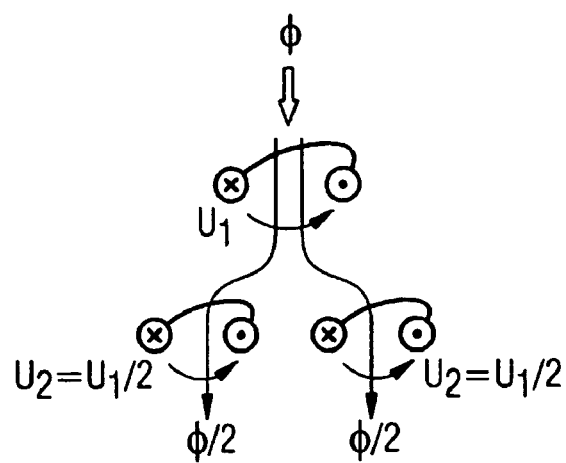
FIG. 1 shows a simplified schematic representation for explaining the splitting of the flux into several paths as applied in the transformer according to the present invention.

FIG. 1 illustrates the principle fractional turns with respect to half turns. Fractional turns may be quarter turns, ⅛ turns, 1/16 turns or other. As may be taken from FIG. 1, the flux φ from a primary winding is split into two paths, each path with φ/2. Each flux φ/2 is fed through a secondary winding where it induces only half of the primary voltage. The secondary windings are connected in parallel to achieve a high output current and a good coupling between primary and secondary windings. Preferably, the flux path, as well as the windings of the secondary side, are uniform in order to avoid flux and current imbalances which may cause undesired losses. This principle is applied in the exemplary embodiments of the transformers explained in the following.

Figure 2:
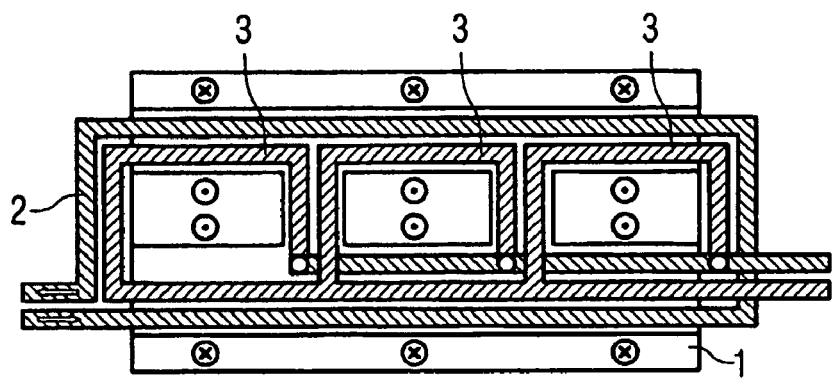
FIG. 2 shows a cross-sectional top view of an exemplary embodiment of a linear transformer according to the present invention showing winding tracks and the magnet core.

FIG. 2 shows a cross-sectional top view of a linear transformer with a 1:1/3 transfer ratio according to an exemplary embodiment of the present invention. The cross-sectional top view of FIG. 2 shows a primary winding 2 and a plurality of turns of the secondary windings 3. Reference numeral 1 designates a soft magnetic core made of a ferrite polymer compound (FPC).

According to an aspect of the present invention, the polymer compound may comprise a polymer matrix and a soft magnetic powder, consisting of soft magnetic particles such as ferrite powder particles or iron powder. Also, nickel-iron, μ-metal, amorphous iron, nano-crystalline iron or iron nano-particles may be used. Furthermore, for power applications, power ferrites having a moderate permeability may be used. This may allow for reduced losses.

Also, for Electro-Magnetic Interference (EMI) applications, EMI-ferrites may be used, having a high permeability. Advantageously, this may allow to control losses in a greater frequency range. Also, for HF-applications, HF-ferrites with small losses but a significantly large frequency range may be used. In the lower frequency range, MnZn ferrites may be used. For higher frequencies (low permeability) NiZn-ferrites may be used. In the high frequency range (GHz), Hexa-ferrites may be used.

According to a preferred embodiment of the present invention, a combination of approximately 30 weight-percent (wt-%) magnesium-zinc-ferrites and of approximately 70 wt-% nickel-zinc-ferrites may be used as ferrite powder particles. Such composite material may then comprise approximately 75 wt-% to 98 wt-% ferrite powder. It may also comprise between approximately 85 wt-% and 92 wt-% ferrite powder. In particular, it may be advantageous to have approximately 88 wt-% ferrite powder and 12 wt-% epoxy resin. A grain size of the soft magnetic powder particles may range from 10 μm to 35 μm up to 80 μm to 110 μm. The form of the particles may be spherical or irregular. A TG value of the polymer matrix (such as of a thermoset) may be above 120° C. These parameters may be selected to control the viscosity during the manufacturing or may also be selected with regard to medical aspects to ensure a medically unproblematic manufacturing.

The polymer matrix may, for example, be an epoxy resin, which, for example, is compatible with FR4 printed circuit boards. However, it is also possible to use or apply other materials such as high temperature thermoplastics, such as polyetheretherketon (PEEK) or polyphenylensulfid (PPS). Such high temperature thermoplastics are compatible with, for example, flexible polyamide foils, which may be referred to as flex foils.

As may be taken from FIG. 2, the primary winding 2 is such that it surrounds the secondary windings 3 which are arranged in an area of the primary winding. The soft magnetic core 1 is provided on sides of the primary winding 2. The core 1 also extends through recesses in the inner areas of the secondary windings 3. Preferably, as depicted in FIG. 2, a magnetic flux induced during operation of this transformer has a direction out of the image plane in the parts of the core 1 extending through the inner areas of the secondary windings 3. In contrast, the flux direction in the parts of the core 1, arranged on sides of the primary winding 2, is into the image plane of FIG. 2. The flow directions may also be opposite to the depicted ones. With alternating fields, the flow directions change periodically.

As mentioned above, the linear transformer depicted in FIG. 2 has a 1:1/3 transfer ratio. However, the arrangement depicted in FIG. 2 may be extended to any further transfer ratios.

Figure 3:
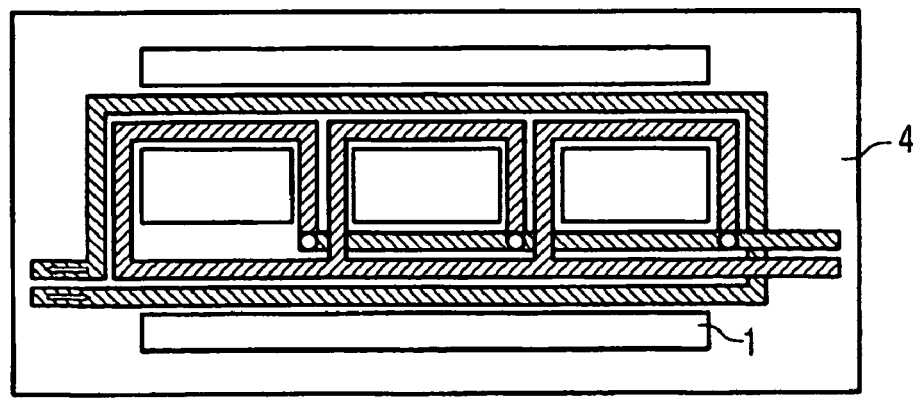
FIG. 3 shows another cross-sectional top view of the linear transformer depicted in FIG. 2 showing winding tracks and the printed circuit board.

FIG. 3 shows another cross-sectional top view of the linear transformer according to an exemplary embodiment of the present invention depicted in FIG. 2. The cross-sectional top view of FIG. 3 shows the printed circuit board 4 with the winding tracks for forming the primary and secondary windings. As may be taken from FIG. 3, there are 5 recesses in the printed circuit board 4. There are three smaller recesses provided in a middle portion of the printed circuit board 4 and two elongated recesses provided in upper and lower portions of the printed circuit board 4. A comparison of FIGS. 2 and 3 shows that the three recesses in the middle portion are provided for the core portions extending through the secondary windings, whereas the elongated recesses are provided for the core portions surrounding the primary winding 2. The primary winding 2 extends between the elongated recesses and surrounds the three recesses in the middle portion. The secondary windings 3, respectively, surround one of the three middle recesses.

Figure 4:
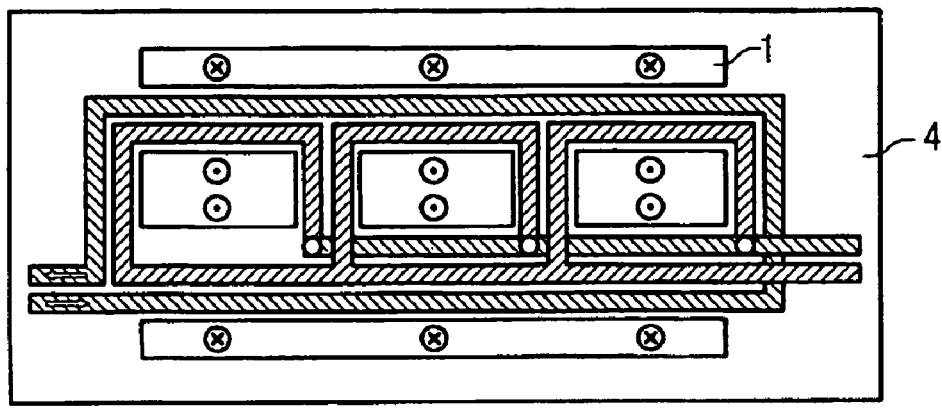
FIG. 4 shows another cross-sectional top view of the exemplary embodiment of the linear transformer depicted in FIG. 2 showing the printed circuit board with the magnet core.

FIG. 4 shows another cross-sectional top view of the linear transformer according to an exemplary embodiment of the present invention depicted in FIG. 2. The cross-sectional top view of FIG. 4 shows the printed circuit board 4 with the soft magnetic core 1. As mentioned above, the soft magnetic core is made of ferrite polymer compound. As may be taken from FIG. 4, a direction of the magnetic flux induced in the magnetic core 1 during operation of the transformer is such that it extends into the image plane of FIG. 4 in the elongated recesses, whereas it is directed out of the image plane of FIG. 4 in the three recesses in the middle portion of the printed circuit board.

Figure 5:
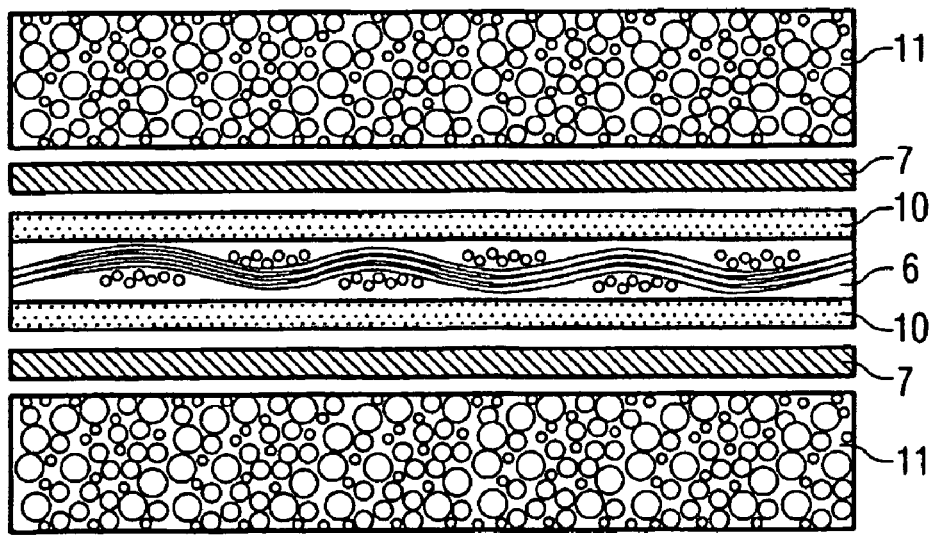
FIG. 5 shows a first step of an exemplary embodiment of a method of manufacturing a transformer according to the present invention.

In the following, with reference to FIGS. 5 to 7, an exemplary embodiment of a method of manufacturing a transformer, such as depicted in FIGS. 2 to 4, is described. FIG. 5 shows a first step of the method of manufacturing the transformer according to an exemplary embodiment of the present invention. In particular, FIG. 5 shows a cross-sectional view of the material layers used for manufacturing the transformer.

As may be taken from FIG. 5, a printed circuit board 6 is provided having conductive layers 10 such as copper layers provided on upper and/or lower sides thereof. Furthermore, insulating layers 7 are provided which are sandwiched between the conductive layers 10 of the printed circuit board 6 and ferrite polymer compound layers 11.

As may be taken from FIG. 5, contrary to the prior art discussed above, no specially shaped core is required. Instead, two layers of a simple unstructured ferrite polymer compound (FPC) are used. Those unstructured ferrite polymer compound layers may be manufactured in large amounts and are less expensive and complicated to manufacture.

Figure 6:
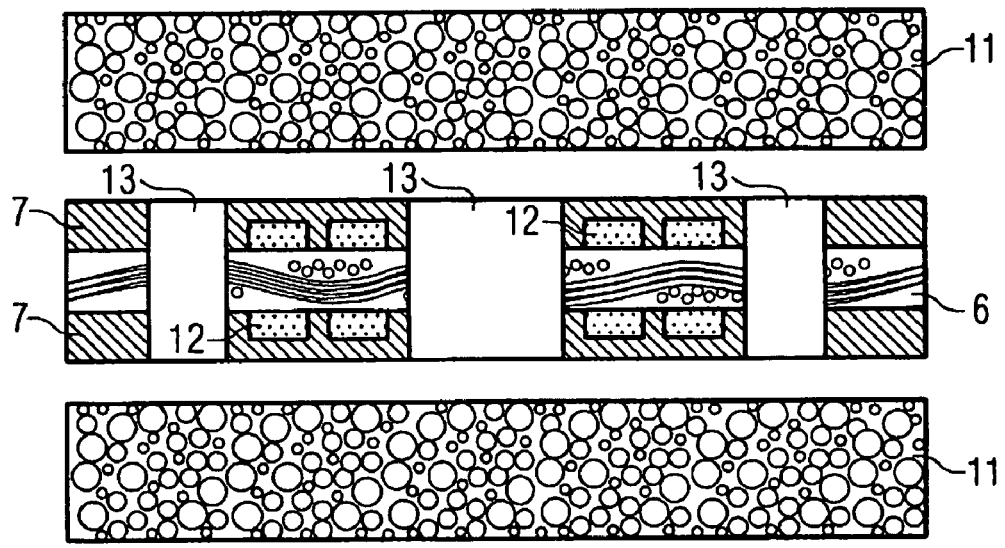
FIG. 6 shows a second step of the exemplary embodiment of the method of manufacturing a transformer according to the present invention.

FIG. 6 shows a second step of an exemplary embodiment of a method of manufacturing a transformer according to the present invention. FIG. 6 shows a cross-sectional view of the layers of the transformer. As may be taken from FIG. 6, the conductive layers 10 of the printed circuit board were structured, for example, by using a photolithographic process and a subsequent etching to form the primary and secondary windings 12. Then, the insulating layers 7 are provided on the upper and lower sides of the printed circuit board 6 for insulating the windings 12. Also holes or recesses 13 were formed in the printed circuit board where top and bottom core layers should be interconnected. The recesses 13 are provided to accommodate portions of the core.

Figure 7:
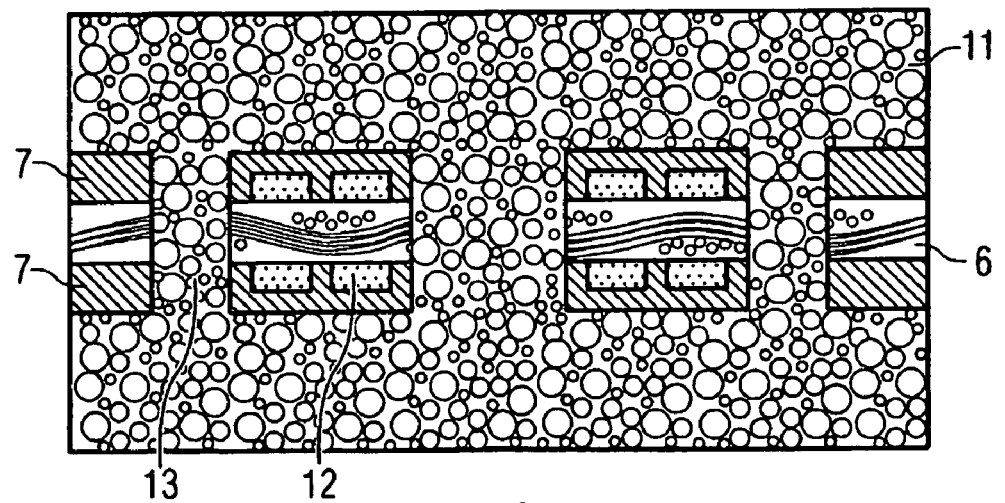
FIG. 7 shows a third step of the exemplary embodiment of the method of manufacturing the transformer according to the present invention.

FIG. 7 shows a cross-sectional view of the transformer corresponding to a third manufacturing step of the exemplary embodiment of the method of manufacturing the transformer according to the present invention.

As may be taken from FIG. 7, the ferrite polymer compound layers 11 were laminated onto the printed circuit board 6. According to an aspect of the present invention, the ferrite polymer compound was selected such that during lamination the ferrite polymer compound filled the holes 13 to form interconnections between upper and lower layers of the polymer ferrite core. Also, the conditions during the lamination process according to an aspect of the present invention are adapted such that the polymer compound layers 11 fill the holes or recesses 13 after lamination. For this, a temperature or pressure occurring during the lamination process may be controlled accordingly.

Advantageously, due to the lamination of the ferrite polymer compound to the printed circuit board, the ferrite polymer compound adheres to the printed circuit board which allows the forming of a solid and reliable device.

Furthermore, according to the exemplary embodiment of the method of manufacturing the transformer in accordance with the present invention, no structured or preformed core is required. Instead, unstructured ferrite polymer compound layers may be used.

Advantageously, the method according to the present invention may be applied as a batch process.

Figure 8:
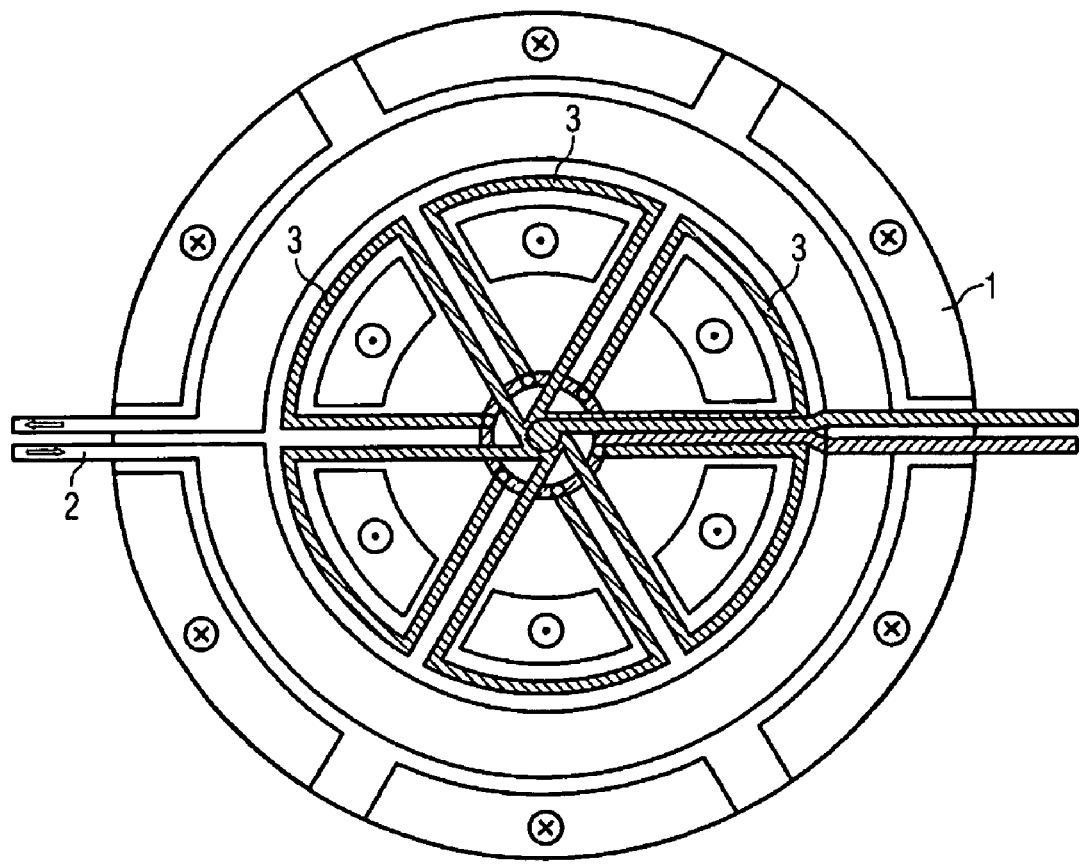
FIG. 8 shows an exemplary embodiment of a cylindrical transformer according to the present invention manufactured by the method according to the present invention.

FIG. 8 shows another exemplary embodiment of a transformer according to the present invention. The transformer depicted in FIG. 8 is a cylindrical transformer with a transfer ratio of 1:1/6. FIG. 8 shows a top view of the cylindrical transformer. As may be taken from FIG. 8 six secondary windings 3 are provided in the inner area of the primary winding 2. Within the inner region of each of the secondary windings 3 is provided a core portion where the direction of the magnetic flux induced during operation of the transformer extends out of the image plane of FIG. 8. Surrounding the primary winding 2, there are provided other core portions where the magnetic flux direction of the magnetic flux occurring during operation of the transformer extends into the image plane of FIG. 8. The secondary windings 3 are interconnected in the center of the circle. Advantageously, due to this the tracks of each turn of the secondary windings 3, and the interconnection to it, has the same length avoiding imbalances which may cause undesired losses. The transformer depicted in FIG. 8 may be manufactured by the method described with reference to FIGS. 5 to 7.

Advantageously, according to the present invention transformers, in particular planar transformers having fractional turns, may be provided at reduced costs. In particular, according to the present invention no pre-manufacturing of a core is required since simple layers of a structured ferrite polymer compound may be used for forming the core of the transformer. Thus, a method and device are provided allowing for manufacturing at reduced costs making such transformers with fractional turns attractive for high volume electronics.

The invention claimed is:

1. A transformer, comprising:
  a printed circuit board having an upper side and a lower side;
  a conductive layer on the upper and lower sides for structuring a primary winding and a plurality of secondary windings, the upper side is an oppositely facing side of the printed circuit board as compared to the lower side of the printed circuit board;
  structured paths on the upper and lower sides; and
  a ferrite polymer compound molded into the structured paths,
  wherein the upper and lower sides of the printed circuit board form a core of the transformer.

2. The transformer of claim 1, wherein the structured path of the printed circuit board includes one or more first recesses and the ferrite polymer compound is molded on to the printed circuit board in non-rigid form, such that the ferrite polymer compound substantially covers the first recesses and covers at least parts of the upper and lower sides of the printed circuit board.

3. The transformer of claim 2, wherein the primary winding surrounds the plurality of secondary windings which are provided in an inner area of the primary winding such that a fractional winding turn is formed, and each first recess is surrounded by at least one of the plurality of secondary windings.

4. The transformer of claim 3, wherein:
the primary winding surrounds a first number secondary windings;
a second number of first recesses is provided in the structured path of the printed circuit board;
each of the first recesses is surrounded by at least one of the secondary windings;
the first number corresponds to the second number;
second recesses are formed on sides of the primary winding outside of the inner area;
the ferrite polymer compound is applied to the printed circuit board such that it substantially fills the second number of first recesses and the second recesses and at least parts of the upper and lower sides of the printed circuit board physically the ferrite polymer compound on the upper side to the ferrite polymer compound on the lower side;
the arrangement of the primary and secondary windings and the core is such that during operation of the planar transformer, a flux trough the primary winding is split into a third number of paths; and
the third number corresponds to the first number and the second number.

5. The transformer of claim 2, wherein at least one of the first recesses includes a through hole such that the ferrite polymer compounds on the upper and lower sides are connected by a flowed portion of ferrite polymer compound via the hole.

6. The transformer of claim 5, wherein the first recesses are located within the plurality of secondary windings.

7. The transformer of claim 6, including second recesses that are located outside an inner area of the primary winding.

8. The transformer of claim 7, further comprising through holes in the second recesses, such that the ferrite polymer compound on the upper and lower sides is connected via the holes.

9. The transformer of claim 1, wherein the transformer has fractional turns.

10. The transformer of claim 1, wherein the plurality of secondary windings are connected in parallel.

11. The transformer of claim 1, wherein the primary winding is arranged as a circle, and the secondary windings are arranged as pie-shaped segments of the circle.

12. The transformer of claim 11, wherein an end of each secondary winding is coupled to a common node that is located substantially at a center of the circle.

13. The transformer of claim 12, including first recesses that are located within each secondary winding, and one or more second recesses that are located adjacent an outer perimeter of the circle.

14. The transformer of claim 1, wherein the ferrite polymer compound is molded directly to the printed circuit board.

15. A method of manufacturing a transformer, the method comprising acts of:
providing a printed circuit board having at least one conductive layer on each of an upper side and a lower side, the upper side is provided on an oppositely facing side of the printed circuit board as compared to the lower side of the printed circuit board;
forming a primary winding and a plurality of secondary windings on the printed circuit board by structuring the at least one conductive layer on the upper and lower sides;
forming a structured path for a ferrite polymer compound; and
applying the ferrite polymer compound in non-rigid form to the upper and lower sides of the printed circuit board for forming a core of the transformer, wherein the ferrite polymer compound is formed into the core by the structured path during the applying act.

16. The method of claim 15, wherein the act of applying the ferrite polymer compound comprises an act of applying the ferrite polymer compound in an unstructured form.

17. The method of claim 15, comprising an act of forming first recesses in the structured path of the printed circuit board,
wherein in the act of applying the ferrite polymer compound to the printed circuit board the ferrite polymer compound is applied to the printed circuit board under a condition of at least one of an elevated heat and pressure such that upon application, the ferrite polymer compound substantially flows into the first recesses and covers at least parts of the upper and lower sides of the printed circuit board.

18. The method of claim 17, the act of forming the primary winding and the plurality of secondary windings comprises an act of forming the primary winding surrounding the plurality of secondary windings which are provided in an inner area of the primary winding such that a fractional winding turn is formed, and each first recess is surrounded by at least one of the plurality of secondary windings.

19. The method of claim 18, the act of forming the primary winding and the plurality of secondary windings comprises an act of forming the primary winding surrounding a first number of secondary windings, the method comprising acts of:
providing a second number of first recesses in the structured path of the printed circuit board such that each of the first recesses is surrounded by at least one of the secondary windings, the first number corresponds to the second number; and
forming second recesses on sides of the primary winding outside of the inner area,
in the act of applying the ferrite polymer compound the ferrite polymer compound is applied to the printed circuit board such that it substantially flows into and fills the second number of first recesses and the second recesses and at least parts of the upper and lower sides of the printed circuit board physically coupling the ferrite polymer compound on the upper side to the ferrite polymer compound on the lower side, the arrangement of the primary and secondary windings and the core is such that during operation of the planar transformer, a flux trough the primary winding is split into a third number of paths, and the third number corresponds to the first number and the second number.

20. The method of claim 17, further comprising an act of forming a through hole in at least one of the first recesses, such that the ferrite polymer compound on the upper and lower sides is connected via the hole.

21. The method of claim 15, wherein the ferrite polymer compound is adhered directly to the printed circuit board as a result of the act of applying the ferrite polymer compound.

* * * * *